United States Patent
Hung et al.

(10) Patent No.: US 11,942,185 B2
(45) Date of Patent: Mar. 26, 2024

(54) MEMORY DEVICE AND METHOD

(71) Applicant: Taiwan Semiconductor Manufacturing Company, Ltd., Hsinchu (TW)

(72) Inventors: Je-Min Hung, Kaohsiung (TW); Win-San Khwa, Taipei (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 111 days.

(21) Appl. No.: 17/832,261

(22) Filed: Jun. 3, 2022

(65) Prior Publication Data

US 2023/0162769 A1    May 25, 2023

Related U.S. Application Data

(60) Provisional application No. 63/281,908, filed on Nov. 22, 2021.

(51) Int. Cl.
| | |
|---|---|
| *G11C 7/12* | (2006.01) |
| *G06F 7/544* | (2006.01) |
| *G11C 7/10* | (2006.01) |
| *G11C 7/14* | (2006.01) |
| *G11C 7/16* | (2006.01) |
| *G11C 7/22* | (2006.01) |

(52) U.S. Cl.
CPC ............ *G11C 7/222* (2013.01); *G06F 7/5443* (2013.01); *G11C 7/1063* (2013.01); *G11C 7/109* (2013.01); *G11C 7/12* (2013.01); *G11C 7/14* (2013.01); *G11C 7/16* (2013.01)

(58) Field of Classification Search
CPC ....... G11C 7/222; G11C 7/1063; G11C 7/109; G11C 7/12; G11C 7/14; G11C 7/16; G11C 7/062; G11C 7/1069; G11C 2207/068; G11C 7/067; G11C 7/1006; G11C 11/54; G06F 7/5443; G06N 3/065
See application file for complete search history.

(56) References Cited

U.S. PATENT DOCUMENTS

2023/0031841 A1* 2/2023 Badaroglu ............ G06F 7/5306

* cited by examiner

*Primary Examiner* — Xiaochun L Chen
(74) *Attorney, Agent, or Firm* — Merchant & Gould P.C.

(57) ABSTRACT

An Input/Output (I/O) circuit for a memory device is provided. The I/O circuit includes a charge integration circuit coupled to a bitline of the memory device. The charge integration circuit provides a sensing voltage based on a decrease of a voltage on the bitline. A comparator is coupled to the charge integration circuit. The comparator compares the sensing voltage with a reference voltage and provides an output voltage based on the comparison. A time-to-digital converter coupled to the comparator. The time-to-digital convertor converts a time associated with the output voltage to a digital value.

20 Claims, 11 Drawing Sheets

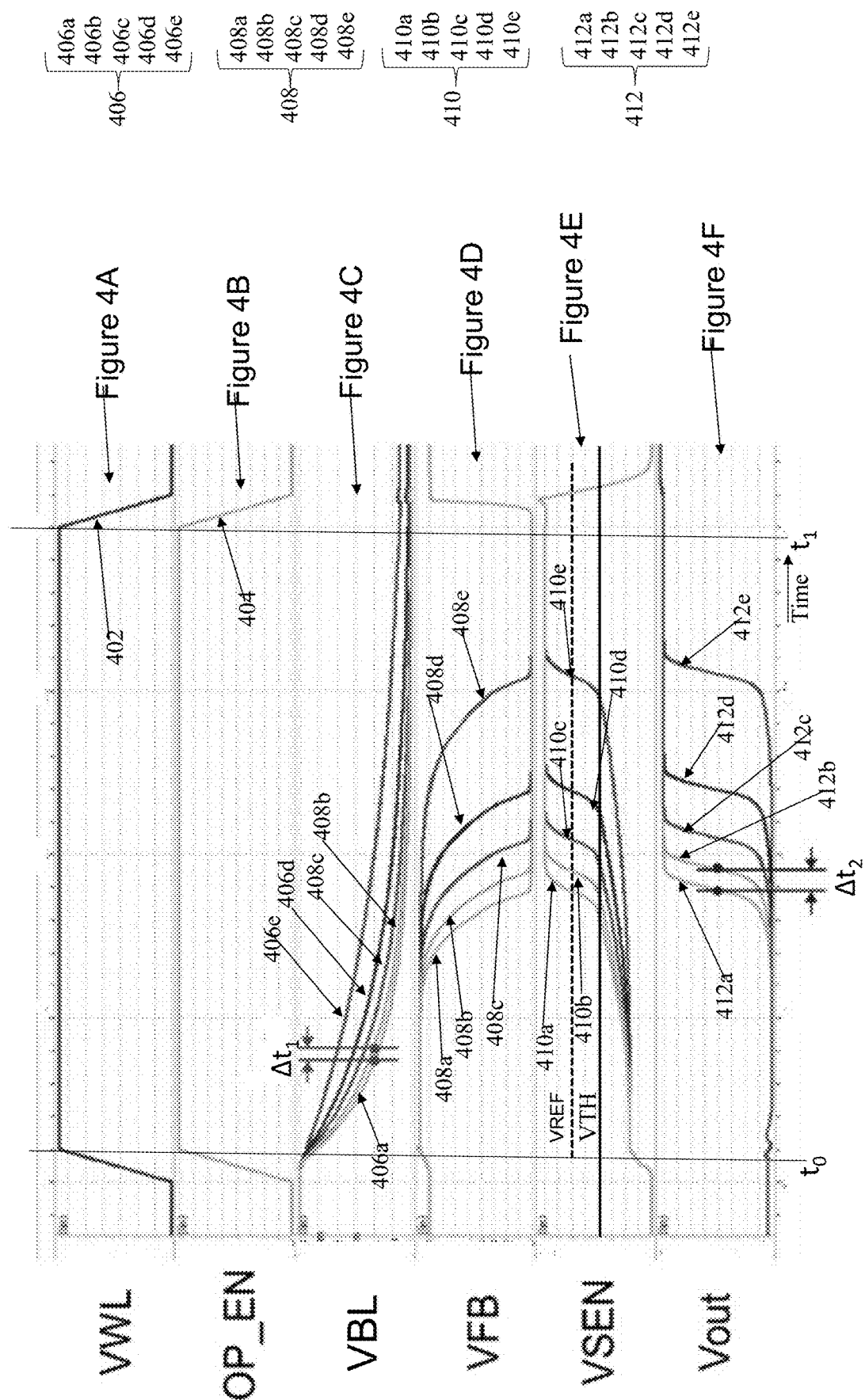

MEMORY DEVICE AND METHOD

CROSS-REFERENCE TO RELATED APPLICATIONS

This application claims the benefit of U.S. Provisional Application No. 63/281,908, filed Nov. 22, 2021, and titled "MEMORY DEVICE AND METHOD," the disclosure of which is hereby incorporated herein by reference.

BACKGROUND

This disclosure generally relates to memory device, for example, a compute-in-memory ("CIM"), and more specifically relates to input output (IO) circuits for a CIM. The CIM is used in data processing, such as Multiply-Accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications. Efforts are ongoing to improve the performance of compute-in-memory systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 4A illustrates a graph representing the word line voltage VWL in accordance with some embodiments of the disclosure.

FIG. 4B illustrates a graph representing the enable signal OP_EN in accordance with some embodiments of the disclosure.

FIG. 4C illustrates a graph representing the bitline voltages VBLs in accordance with some embodiments of the disclosure.

FIG. 4D illustrates a graph representing the feedback node voltages VFBs in accordance with some embodiments of the disclosure.

FIG. 4E illustrates a graph representing the sensing voltages VSENs in accordance with some embodiments of the disclosure.

FIG. 4F illustrates a graph representing the output voltages Vouts in accordance with some embodiments of the disclosure.

DETAILED DESCRIPTION

Figure 1:
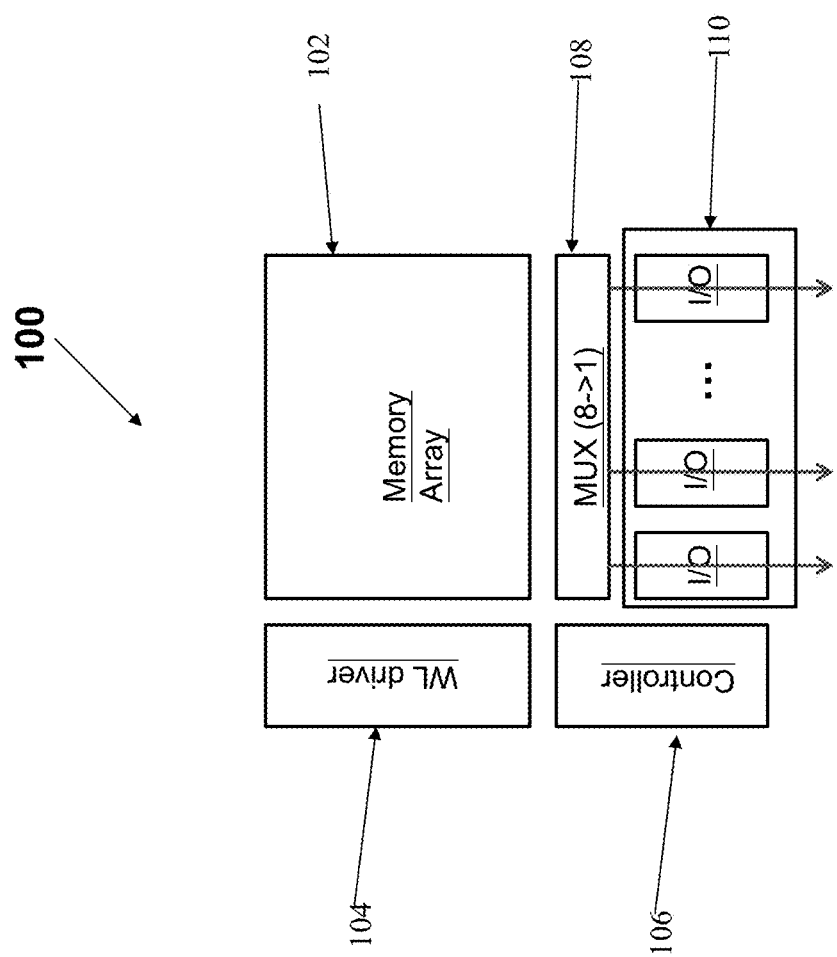
FIG. 1 illustrates an example Compute-in-Memory (CIM) device in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure relates generally to in-memory computing, or compute-in-memory ("CIM"), and more specifically relates to memory arrays used in data processing, such as multiply-accumulate ("MAC") operations. Compute-in-memory or in-memory computing systems store information in the main random-access memory (RAM) of computers and perform calculations at memory cell level, rather than moving large quantities of data between the main RAM and data store for each computation step. Because stored data is accessed much more quickly when it is stored in RAM, compute-in-memory allows data to be analyzed in real time, enabling faster reporting and decision-making in business and machine learning applications.

Various memory cell technologies may be employed for MAC operations, such as flash memory, magnetic random access memory (MRAM), resistive random access memory (RRAM), static random access memory (SRAM), etc. For MAC operations using memory technology such as RRAM, the MAC operations are performed based on current-domain or voltage-domain. However, the current-domain MAC operations and the voltage-domain MAC operations have some disadvantages. For example, for the current-domain MAC operation, in order to support all of the memory cells corresponding to a bitline, the energy consumption is large. In addition, based on a delay between a bitline and a source line, a current developing time of sensing current is long. Similarly, a sensing margin of the voltage-domain MAC operation is small. Moreover, it may be difficult to define a reference voltage or a reference time point to judge a non-linear MAC operation result.

In accordance with example embodiments, the disclosure provides a time-domain MAC operation rather than operations based on a voltage-domain or current-domain. An Input/Output (I/O) circuit is provided which includes a sensing node. When a bitline corresponding to the I/O circuit is discharged, the I/O circuit charges the sensing node in a charge integration manner based on discharging of the bitline. The charging speed of the sensing node decreases based on the charge integration manner. Thus, the sensing node converts the discharging bitline voltage or current signal to a time signal. Therefore, and discussed in greater detail in the following sections of the disclosure, a sensing margin of the time-domain MAC operation is wider or greater than the sensing margin of the voltage-domain MAC operation, making it easier to determine states of the memory cells used for the MAC operations.

FIG. 1 illustrates an example CIM device 100 in accordance with some embodiments of the disclosure. CIM device 100 includes a memory array 102, a Word Line (WL) driver 104, a controller 106, a plurality of multiplexers 108, and a plurality of I/O circuits 110. In examples, CIM device 100 can include more components than shown in FIG. 1.

Memory array 102 includes a plurality of memory cells. Each of the plurality of memory cells of memory array 102 can store one bit of data, for example, a bit value of 0 or a bit value of 1. In examples, each of the plurality of memory cells are RRAM memory cells, and as such include a transistor, such as a MOS transistor and one resistor. The transistor operates as a switch, interposed between the resistor and a bitline BL, with a first Source/Drain (S/D) terminal of the transistor connected to the bitline BL and a second S/D terminal of the transistor connected to a first terminal of the resistor. A second terminal of the resistor is connected to a source line SL. In some examples, the second terminal of the resistor is floating or is connected to a voltage terminal configured to receive a voltage level of ½VDD, where the VDD is a supply voltage. The data is stored as a resistive state of the resistor. For example, a first (e.g., high) resistive state may correspond to a first data value (e.g., a logical '0') and a second (e.g., low) resistive state may correspond to a second data value (e.g., a logical '1'), or vice versa. A gate of the transistor is connected to a word line WL. In examples, the VDD is in range of 0.7-0.8 volts.

The plurality of memory cells of memory array 102 are arranged in a matrix of a plurality of rows and a plurality of columns. For example, memory array 102 can include 512 rows and 256 columns (a 256×512 memory). Each of the plurality of rows can include a first plurality of memory cells and each of the plurality of columns can include a second plurality of memory cells. Each of the first plurality of memory cells in a row is connected to a word line WL and each of the second plurality of memory cells in a column is connected to a bitline BL. Thus, memory array 102 includes a plurality of word lines WLs and a plurality of bitlines BLs. For example, the 256×512 memory can include 256 bitlines and 512 word lines.

For a MAC operation, WL driver 104 selects one or more of the plurality of word lines WLs of memory array 102 and charges the selected word lines WL to a predetermined voltage (for example, to a logic high) for a MAC operation. In examples, WL driver 104 selects one or more word lines WLs based on an address. A voltage on a word line WL is represented as VWL. Thus, the word line voltage VWL is at a logic low when the word line WL is deactivated (that is, not selected and not charged) and is at a logic high when the word line WL is activated (that is, selected and charged). In addition, the word line voltage bar VWLB is at a logic high when the word line voltage VWL is at a logic low and the word line voltage bar VWLB is at a logic low when the word line voltage VWL is at a logic high. Controller 106 is configured to control the MAC operation. For example, controller 106 can provide a signal to initiate the MAC operation to one or more of WL driver 104, plurality of multiplexers 108, and plurality of I/O circuits 110.

A plurality of multiplexers 108 connect the bit lines BL of memory array 102 to a corresponding plurality of I/O circuits 110 for the MAC operation. In examples, each of plurality of multiplexers 108 can be an 8-to-1 multiplexer. That is, each of plurality of multiplexers 108 is associated with 8 bitlines BLs and, when enabled, connect one of the 8 bitlines BLs to one of plurality of I/O circuits 110. For example, the 256×512 memory can include thirty two 8-to-1 multiplexers.

Plurality of I/O circuits 110 read data from memory array 102. For example, each of plurality of I/O circuits 110 is connected to one of the plurality of bitlines BLs and read data from memory cells connected to the bitline BL. Each of plurality of I/O circuits 110 is associated with a predetermined number of bitlines BLs, for example, eight. Thus, the 256×512 memory can include thirty two I/O circuits 110. Plurality of I/O circuits 110 are described in greater detail in the following sections of the disclosure. In examples, each of plurality of I/O circuits 110 is associated with one of plurality of multiplexers 108.

Figure 2:
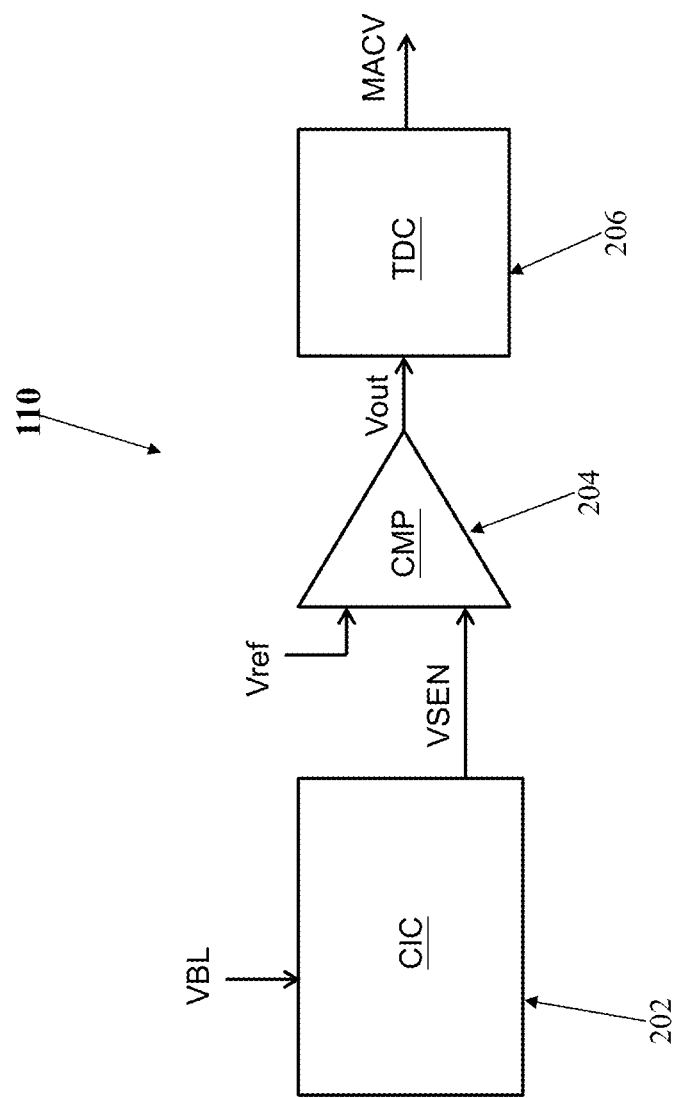
FIG. 2 is a schematic diagram illustrating an example of a CIM memory array in accordance with some embodiments.

FIG. 2 illustrates an I/O circuit 110 in accordance with some embodiments of the disclosure. As illustrated in FIG. 2, I/O circuit 110 includes a Charge Integration Circuit (CIC) 202, a comparator 204, and a Time-to-Digital convertor (TDC) 206. CIC 202 is connected to a bitline BL. CIC 202 provides a sensing voltage VSEN as an output based on a discharge of a bitline voltage VBL at an output terminal. The rate of discharge of the bitline voltage VBL varies depending on the resistance states of memory cells (i.e. the number of high resistive state/logic 0 memory cells vs. the number of low resistive state/logic 1 memory cells) connected to the bitline BL. Thus, sensing voltage VSEN provides an indication of the number of high and low resistive state memory cells based on the discharge of the bitline voltage VBL. CIC 202 is discussed in greater detail with reference to FIG. 3 of the disclosure.

Comparator 204 compares the sensing voltage VSEN with a reference voltage Vref and provides an output voltage Vout based on the comparison. For example, a first input terminal of comparator 204 is connected to a reference voltage node and a second input terminal of comparator 204 is connected to the output terminal of CIC 202. Comparator 204 receives the sensing voltage VSEN from CIC 202, receives the reference voltage Vref from the reference voltage node, compares the sensing voltage VSEN with the reference voltage Vref, and provides the output voltage Vout at an output terminal based on the comparison. For example, when the sensing voltage VSEN is less than the reference voltage Vref, the output voltage Vout is pulled to a logic low and when the sensing voltage VSEN is equal to or greater than the reference voltage Vref, the output voltage Vout is raised to a logic high. In some examples, comparator 204 is an operational amplifier. Thus, as will be discussed further below, in some examples the comparator 204 provides output voltage Vout when the sensing voltage VSEN crosses a threshold level (i.e. reference voltage Vref). This, in turn, indicates a time period for the discharge of the bitline voltage VBL, which is based on the resistance states of the memory cells on the respective bitlines BL.

TDC 206 provides the MAC values (referred to as MACV) as an output based on a time associated with the output voltage Vout. In other words, TDC 206 converts the time period represented by the output voltage Vout to a digital output signal, i.e. MACV. For example, an input terminal of TDC 206 is connected to the output terminal of comparator 204. TDC 206 receives the output voltage Vout from comparator 204 and provides the MACV as the output of a MAC operation at an output terminal based on the time associated with the output voltage Vout. TDC 206 is discussed in greater detail with reference to FIGS. 5-11 of the disclosure.

Figure 3:
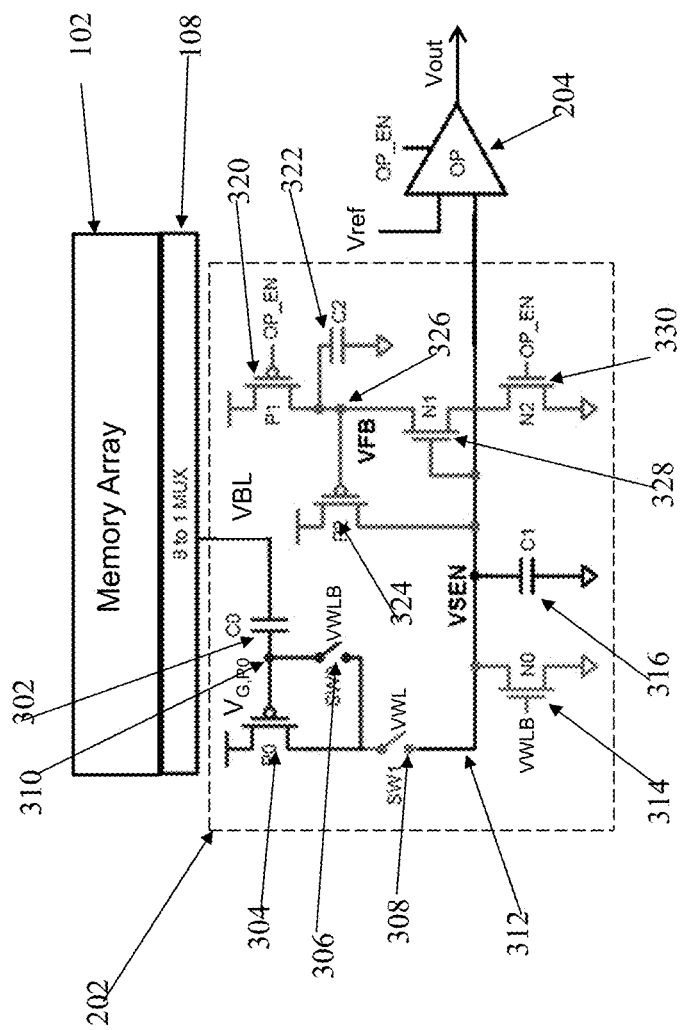
FIG. 3 is a schematic diagram illustrating an example of a CIM memory cell in accordance with some embodiments.

FIG. 3 illustrates an example circuit diagram of CIC 202 in accordance with some embodiments of the disclosure. The CIC 202 is configured to integrate the discharging bitline voltage VBL signal. Thus, sensing voltage VSEN is charged based on the discharging bitline voltage VBL signal. As noted above, the discharging bitline voltage VBL signal provides an indication of resistance states of the memory cells on an associated bitline BL. The CIC 202 functions to decrease the charging speed of the sensing voltage VSEN, increasing the sensing margin of the discharging bitline voltage VBL to more accurately sense such resistance states of the memory cells. The CIC 202 includes various charge storage devices (i.e. capacitors), the charging and/or discharging of which determines the charging speed of the sensing voltage VSEN. More particularly, as shown in FIG. 3, CIC 202 includes a first charge storage device 302 (also referred to as a first capacitor C0 302 or a coupling capacitor C0 302), a first transistor P0 304, a first switch SW0 306, and a second switch SW1 308. A first terminal of first capacitor 302 is connected to a bitline BL, for example, via one of plurality of multiplexers 108, to receive the discharging bitline voltage VBL signal. A second terminal of first capacitor 302 is connected to a first node 310. A gate of first transistor P0 304 is also connected to first node 310. A voltage of first node 310 is represented as $V_{G,P0}$. In examples, a capacitance value of first capacitor C0 302 is 8 fF. In other examples, the capacitance value of first capacitor C0 302 is in a range of 1 fF-100 fF.

A source of first transistor P0 304 is connected to a supply voltage node (that is, the VDD) and a drain of first transistor P0 304 is connected to both a first terminal of first switch SW0 306 and a first terminal of second switch SW1 308. A second terminal of first switch SW0 306 is connected to first node 310. Thus, first switch SW0 306 is connected between the drain of first transistor P0 304 and first node 310. A second terminal of second switch SW1 308 is connected to a second node 312. Thus, second switch SW1 308 is connected between the drain of first transistor P0 304 and second node 312. Second node 312 is also referred to as a sensing node and a voltage of second node 312 is referred to as the sensing node voltage VSEN.

In examples, first switch SW0 306 is switched ON when the word line voltage bar VWLB is at a logic high and second switch SW1 308 is switched ON when the word line voltage VWL is at a logic high. In some examples, both first switch SW0 306 and second switch SW1 308 include a transmission gate or a transistor. In examples, first transistor P0 304 is a p-channel Metal Oxide Semiconductor (PMOS) transistor. However, other types of transistors are within the scope of the disclosure. In addition, first transistor P0 304 is symmetrical. That is, the drain of first transistor P0 304 can be a source and the source of first transistor P0 304 can be a drain.

CIC 202 further includes a second transistor N0 314 and a second charge storage device 316 (also referred to as a second capacitor C1 316). A source of second transistor N0 314 is connected to second node 312 and a drain of second transistor N0 314 is connected to the ground. A gate of second transistor N0 314 is connected to a word line voltage bar VWLB node that provides the word line voltage bar VWLB. A first terminal of second capacitor C1 316 is connected to second node 312 and a second terminal of second capacitor C1 316 is connected to the ground. In examples, a capacitance value of second capacitor C1 316 is 12 fF. In other examples, the capacitance value of second capacitor C1 316 is in a range of 1 fF-100 fF.

In examples, second transistor N0 314 is switched ON when the word line voltage bar VWLB is at a logic high connecting second node 312 to the ground. In examples, second transistor N0 314 is a n-channel Metal Oxide Semiconductor (NMOS) transistor. However, other types of transistors are within the scope of the disclosure. In addition, second transistor N0 314 is symmetrical. That is, the drain of second transistor N0 314 can be a source and the source of second transistor N0 314 can be a drain.

CIC 202 further includes a third transistor P1 320, a third charge storage device 322 (also referred to as a third capacitor C2 322), and a fourth transistor P2 324. A source of third transistor P1 320 is connected to the supply voltage node (that is, the VDD) and a drain of third transistor P1 320 is connected to a third node 326 (also referred to as a feedback node). A gate of third transistor P1 320 is connected to an enable signal node which provides an enable signal OP_EN to the gate of third transistor P1 320. A voltage level of third node 326 is represented as a feedback node voltage VFB.

A first terminal of third capacitor C2 322 is connected to third node 326 and a second terminal of third capacitor C2 322 is connected to the ground. In examples, a capacitance value of third capacitor C2 322 is 2 fF. In other examples, the capacitance value of third capacitor C2 322 is in a range of 0.1 fF-10 fF. A source of fourth transistor P2 324 is connected to the supply voltage node (that is, the VDD) and a drain of fourth transistor P2 324 is connected to second node 312. A gate of fourth transistor P2 324 is connected to third node 326.

Third transistor P1 320 is switched ON when the enable signal OP_EN is at a logic low thereby connecting third node 326 to the VDD and charging third capacitor C2 322. This results in charging of third capacitor C2 322 and the feedback node voltage VFB rising to a logic high. When the feedback node voltage VFB of third node 326 rises to a logic high fourth transistor P2 324 is switched OFF disconnecting second node 312 from the VDD. Thus, when the enable signal OP_EN is at a logic low (i.e. CIC 202 in a standby period), sensing voltage VSEN is also low. Third transistor P1 320 is switched OFF when the enable signal OP_EN is at a logic high for a MAC operation thereby disconnecting third node 326 from the VDD. This results in discharging of third capacitor C2 322 and drop of the feedback node voltage VFB. When the feedback node voltage VFB of third node 326 approaches to a logic low, fourth transistor P2 324 is switched ON connecting second node 312 to the VDD thereby increasing a rate of charging of the sensing voltage VSEN. In examples, both third transistor P1 320 and fourth transistor P2 324 are PMOS transistors. However, other types of transistors are within the scope of the disclosure. In addition, both third transistor P1 320 and fourth transistor P2 324 are symmetrical. That is, the drain of each of third transistor P1 320 and fourth transistor P2 324 can be a source and the source of each of third transistor P1 320 and fourth transistor P2 324 can be a drain.

CIC 202 further includes a fifth transistor N1 328 and a sixth transistor N2 330. A source of fifth transistor N1 328 is connected to third node 326 and a drain of fifth transistor N1 328 is connected to a source of sixth transistor N2 330. A drain of sixth transistor N2 330 is connected to the ground. A gate of fifth transistor N1 328 is connected to second node 312. A gate of sixth transistor N2 330 is connected to the enable signal node which provides the enable signal OP_EN to the gate of sixth transistor N2 330.

Fifth transistor N1 328 is switched ON when the sensing node voltage VSEN approaches a logic high and sixth transistor N2 330 is switched ON when the enable signal OP_EN rises to a logic high thereby connecting third node 326 to the ground. In examples, both fifth transistor N1 328 and sixth transistor N2 330 are NMOS transistors. However, other types of transistors are within the scope of the disclosure. In addition, both fifth transistor N1 328 and sixth transistor N2 330 are symmetrical. That is, the drain of each of fifth transistor N1 328 and sixth transistor N2 330 can be a source and the source of each of fifth transistor N1 328 and sixth transistor N2 330 can be a drain.

In examples, first transistor P0 304, first switch SW0 306, second switch SW1 308, second transistor N0 314, and second capacitor C1 316 form a charge circuit. The charge circuit charges the voltage of second node 312 (that is, the sensing node voltage VSEN) based on a discharge rate of a bitline voltage VBL. In addition, third transistor P1 320, third capacitor C2 322, fourth transistor P2 324, fifth transistor N1 328, and sixth transistor N2 330 form a feedback circuit. Feedback circuit ramps up or accelerates the charging of the voltage of second node 312 (that is, the sensing node voltage VSEN). Second node 312 provides the sensing voltage VSEN.

During a standby period, that is, when a MAC operation is not being performed, the word lines WLs of CIM device 100 are de-activated. That is, during the standby period, the word lines voltages VWLs are at a logic low. Therefore, the word line bar voltage VWLB is at a logic high. In addition, during the standby period, the enable signal OP_EN is at a logic low. Since, the word line voltage VWL is at a logic low, second switch SW1 308 is open disconnecting first node 310 from second node 312. In addition, since the word line bar voltage VWLB is at a logic high, first switch SW0 306 is closed connecting first node 310 with the drain of first transistor P0 304. The voltage of first node 310 (that is, the $V_{G,P0}$) approaches (VDD-VTH), where the VTH is a threshold voltage of first transistor P0 304.

In addition, in the standby period, since the word line voltage bar VWLB is at a logic high, second transistor N0 314 is switched ON connecting second node 312 to the ground. Therefore, the voltage of second node 312 (that is, the sensing node voltage VSEN) is a logic low. Since, the sensing node voltage VSEN is at a logic low, fifth transistor N1 328 is switched OFF. Moreover, since the enable signal OP_EN is at a logic low, sixth transistor N2 330 is also switched OFF.

In the standby period, since the enable signal OP_EN is at a logic low, third transistor P1 320 is switched ON. Therefore, the voltage of third node 326 is pulled up to the supply voltage VDD (that is, the feedback node voltage VFB approaches a logic high). This results in charging of third capacitor C2 322. In addition, since the voltage of third node 326 (that is, the feedback voltage VFB) approaches a logic high, fourth transistor P2 324 is switched OFF isolating second node 312 from the supply voltage VDD.

The enable signal OP_EN goes high to transition from the standby period to a MAC operation, also referred to as a sensing period. One or more of the plurality of word lines WLs are activated (that is, charged to a logic high) to connect the desired memory cells of the array 102 to the bitline. Therefore, in the sensing period, the word line voltage VWL is at a logic high and the word line voltage bar VWLB is at a logic low. Since, the word line voltage VWL is at a logic high and the word line voltage bar VWLB is at a logic low, first switch SW0 306 is switched OFF and second switch SW1 308 is switched ON, which disconnects the drain of first transistor P0 304 from first node 310 and connects it to second node 312. In addition, since the word line voltage bar VWLB is at a logic low, second transistor N0 314 is switched OFF disconnecting second node 312 from the ground.

FIG. 4A illustrates a graph representing the word line voltage VWL in accordance with some embodiments of the disclosure. For example, first plot 402 of FIG. 4A represents the word line voltage VWL of a word line WL of memory array 102. As shown in first plot 402, the word line voltage VWL of the word line WL is at a logic low before a time t0, i.e., the standby period. The word line WL is then selected and charged to a logic high at the time t0 for the MAC operation. The word line voltage VWL on the word line WL remains at a logic high until a time t1 when the word line WL is de-asserted. In examples, the word line WL is de-asserted when the MAC operation is complete. The word line voltage VWL drops to a logic low after the time t1 when the word line WL is de-asserted. In examples, the time period before the time t0 is referred to as the standby period and the time period between the time t0 and time t1 is referred to as a sensing period.

In addition, at the start of the MAC operation, the enable signal OP_EN rises to a logic high. FIG. 4B illustrates a graph representing the enable signal OP_EN in accordance with some embodiments of the disclosure. For example, second plot 404 of FIG. 4B represents the enable signal OP_EN for memory array 102. As shown in second plot 404, the enable signal OP_EN is at a logic low before the time t0. The enable signal OP_EN is then asserted and rises to a logic high at the time t0 for the MAC operation. The enable signal OP_EN remains at a logic high until the time t1. The enable signal OP_EN is then de-asserted and drops to a logic low after the time t1.

Returning back to FIG. 3, during the sensing period, the bitline is connected to I/O circuit 110, which thus receives the discharge bitline voltage VBL. The bitline starts to discharge through I/O circuit 110 and the bitline voltage VBL starts to drop. For example, second switch SW1 308 is closed when the word line WL rises to a logic high and the bitline voltage VBL starts to discharge through CIC 202. A rate of discharge of the bitline voltage VBL is based on a resistance of memory cells connected to the bitline BL, and the total resistance of the memory cells connected to the bitline BL is determined by the number of memory cells in the high resistance state and the number of memory cells in the low resistance state connected to the bitline BL.

FIG. 4C illustrates a graph representing the bitline voltages VBL in accordance with some embodiments of the disclosure. For example, a third plurality of plots 406 (that is, a first third plot 406a, a second third plot 406b, a third third plot 406c, a fourth third plot 406d, and a fifth third plot 406e) of FIG. 4C represent the bitline voltages VBLs for different MAC values (i.e. number of high resistance state and number of low resistance states) on a bitline BL of memory array 102. In examples, first third plot 406a represents the bitline voltage VBL for a first MAC value (e.g. 0 high resistance and 4 low resistance memory cells connected to the bitline BL), second third plot 406b represents the bitline voltage VBL for a second MAC value (e.g. 1 high resistance and 3 low resistance memory cells connected to the bitline BL), third third plot 406c represents the bitline voltage VBL for a third MAC value (e.g. 2 high resistance and 2 low resistance memory cells connected to the bitline BL), fourth third plot 406d represents the bitline voltage VBL for a fourth MAC value (e.g. 3 high resistance and 1 low resistance memory cells connected to the bitline BL), and fifth third plot 406e represents the bitline voltage VBL for a fifth MAC value (e.g. 4 high resistance and 0 low resistance memory cells connected to the bitline BL).

The first MAC value, the second MAC value, the third MAC value, the fourth MAC value, and the fifth MAC value are different from each other. In the example discussed above, the first MAC value is less than the second MAC value, the second MAC value is less than the third MAC value, the third MAC value is less than the fourth MAC value, and the fourth MAC value is less than the fifth MAC value. In examples, the first MAC value represents the lowest MAC value for the memory cells connected to the selected bitline BL.

As shown in FIG. 4C, the bitline voltages VBLs start to drop (i.e. discharge) when the MAC operation is initiated. A rate of drop of the bitline voltages VBLs is dependent on the MAC values associated with the memory cells connected to the bitline BL, which are represented by the resistance states of the memory cells connected to the bitline BL. For example, and as shown in FIG. 4C, the bitline voltage VDL for the first MAC value (represented by first third plot 406a) drops at a faster rate than the bitline voltage VBL for the second MAC value (represented by second third plot 406b). Moreover, and as shown in FIG. 4C, the bitline voltage VBL for the second MAC value (represented by second third plot 406b) drops at a faster rate than the bitline voltage VBL for the third MAC value (represented by third third plot 406c). Furthermore, and as shown in FIG. 4C, the bitline voltage VBL for the third MAC value (represented by third third plot 406c) drops at a faster rate than the bitline voltage VBL for the fourth MAC value (represented by fourth third plot 406d). In addition, and as shown in FIG. 4C, the bitline voltage VBL for the fourth MAC value (represented by fourth third plot 406d) drops at a faster rate than the bitline voltage VBL for the fifth MAC value (represented by fifth third plot 406e).

Returning to FIG. 3, as the voltage of first node 310 (that is, the $V_{G,P0}$) approaches (VDD-VTH-VBL), first transistor P0 304 is switched ON. Switching ON of first transistor P0 304 results in second node 312 being connected to the supply voltage VDD causing the sensing node voltage VSEN to rise or increase. Increase in the sensing node voltage VSEN of second node 312 also results in charging of second capacitor C1 316 which is connected to second node 312. The charging rate of second capacitor C1 316 slows down a charging speed of the voltage of second node 312 (that is, the rate of the sensing node voltage VSEN increase). In examples, the slowing down of the charging speed enlarges a sensing margin of the time-domain MAC operation. For example, as discussed further below, slowing down of the charging speed leads to increase in a time period when the sensing node voltage VSEN reaches the reference voltage Vref which enlarges the sensing margin of the time-domain MAC operation.

FIG. 4E illustrates a graph representing the sensing voltages VSENs in accordance with some embodiments of the disclosure. For example, a fifth plurality of plots 410 (that is, a first fifth plot 410a, a second fifth plot 410b, a third fifth plot 410c, a fourth fifth plot 410d, and a fifth fifth plot 410e) of FIG. 4E represent the sensing voltages VSENs for different MAC values on a bitline BL of memory array 102. In examples, first fifth plot 408a represents the sense voltage VSEN for the first MAC value, second fifth plot 410b represents the sense voltage VSEN for the second MAC value, third fifth plot 410c represents the sense voltage VSEN for the third MAC value, fourth fifth plot 410d represents the sense voltage VSEN for the fourth MAC value, and fifth fifth plot 410e represents the sense voltage VSEN for the fifth MAC value. The first first MAC value, the second MAC value, the third MAC value, the fourth MAC value, and the fifth MAC value are different from each other. For example, the first MAC value is less than the second MAC value, the second MAC value is less than the third MAC value, the third MAC value is less than the fourth MAC value, and the fourth MAC value is less than the fifth MAC value. In examples, the first MAC value represents the lowest MAC value for the memory cells connected to the selected bitline BL. In example, a voltage signal corresponding to the sense voltage VSEN for the first MAC value is also referred to as the SLRS signal.

Returning to FIG. 3, when the enable signal OP_EN is at a logic high, both third transistor P1 320 and fourth transistor P2 324 are switched OFF, and sixth transistor N2 330 is switched ON. As the voltage of second node 312 (that is, the sensing node voltage VSEN) rises, fifth transistor N1 328 is switched ON thereby pulling down the voltage of third node 326 (that is, the feedback node voltage VFB) which results in switching ON of fourth transistor P2 324. When switched ON, fourth transistor P2 324 connects second node 312 to the supply voltage VDD accelerating charging of second node 312. When fourth transistor P2 324 is switched ON, the charging speed of the voltage of second node 312 (that is, the sensing node voltage VSEN) enters a rapid rising voltage range as second node is connected to the supply voltage VDD.

For example, and as shown in FIG. 4E, the sense node voltage VSEN for the first MAC value is pulled up till the threshold voltage VTH at a first rate (i.e. flatter curve) and is pulled up after the threshold voltage VTH at a second rate (i.e. steeper curve), the second rate being higher than the first rate. As discussed above, the feedback circuit of CIC 202 accelerates the charging rate of the sensing node voltage VSEN after the sensing node voltage VSEN reaches the threshold voltage VSEN VTH.

FIG. 4D illustrates a graph representing the feedback node voltages VFBs in accordance with some embodiments of the disclosure. For example, a fourth plurality of plots 408 (that is, a first fourth plot 408a, a second fourth plot 408b, a third fourth plot 408c, a fourth fourth plot 408d, and a fifth fourth plot 408e) of FIG. 4D represent the feedback node voltages VFBs for different MAC values on a bitline BL of memory array 102. In examples, first fourth plot 408a represents the feedback node voltage VFB for the first MAC value, second fourth plot 408b represents the feedback node voltage VFB for the second MAC value, third fourth plot 408c represents the feedback node voltage VFB for the third MAC value, fourth fourth plot 408d represents the feedback node voltage VFB for the fourth MAC value, and fifth fourth plot 408e represents the feedback node voltage VFB for the fifth MAC value. The first MAC value, the second MAC value, the third MAC value, the fourth MAC value, and the fifth MAC value are different from each other. For example, the first MAC value is less than the second MAC value, the second MAC value is less than the third MAC value, the third MAC value is less than the fourth MAC value, and the fourth MAC value is less than the fifth MAC value. In examples, the first MAC value represents the lowest MAC value for the memory cells connected to the selected bitline BL.

As shown in FIG. 4D, the feedback node voltages VFBs start to drop when the MAC operation is initiated in response to the discharging bitline voltage VBL. A rate of drop of the feedback node voltages VFBs is also dependent on the MAC value associated with the memory cells connected to the bit line BL, which are represented by the resistance states of the memory cells connected to the bitline BL. For example, and as shown in FIG. 4D, the feedback node voltage VFB for the first MAC value (represented by first fourth plot 408a) drops at a faster rate than the feedback node voltage VFB for the second MAC value (represented by second fourth plot 408b). Moreover, and as shown in FIG. 4D, the feedback node voltage VFB for the second MAC value (represented by second fourth plot 408b) drops at a faster rate than the feedback node voltage VFB for the third MAC value (represented by third fourth plot 408c). Furthermore, and as shown in FIG. 4D, the feedback node voltage VFB for the third MAC value (represented by third fourth plot 408c) drops at a rate faster than the feedback node voltage VFB for the fourth MAC value (represented by fourth fourth plot 408d). In addition, and as shown in FIG. 4D, the feedback node voltage VFB for the fourth MAC value (represented by fourth fourth plot 408d) drops at a rate faster than the feedback node voltage VFB for the fifth MAC value (represented by fifth fourth plot 408e).

Figure 4G:
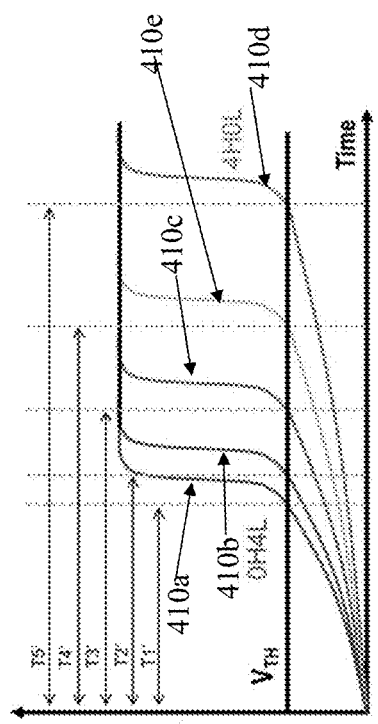
FIG. 4G illustrates a graph illustrating times of the sensing node voltage VSEN reaching the threshold voltage VTH in accordance with some embodiments of the disclosure.

Moreover, the sensing node voltage VSEN for different MAC values reaches the threshold voltage VTH at different time due to their respective different rates of increase. FIG. 4G illustrates a graph illustrating a time for the sensing node voltage VSEN reaching the threshold voltage VTH for each of the different MAC values (based on resistance states of the memory cells) in accordance with some embodiments of the disclosure. For example, the sensing node voltage VSEN for the first MAC value (e.g. 0 high resistance and 4 low resistance memory cells connected to the bitline BL) rises to the threshold voltage VTH at a time T1, the sensing node voltage VSEN for the second MAC value (e.g. 1 high resistance and 3 low resistance memory cells connected to the bitline BL) reaches the threshold voltage VTH at a time T1, the sensing node voltage VSEN for the third MAC value (e.g. 2 high resistance and 2 low resistance memory cells connected to the bitline BL) reaches the threshold voltage VTH at a time T3, the sensing node voltage VSEN for the fourth MAC value (e.g. 3 high resistance and 1 low resistance memory cells connected to the bitline BL) reaches the threshold voltage VTH at a time T4, and the sensing node voltage VSEN for the fifth MAC value (e.g. 4 high resistance and 1 low resistance memory cells connected to the bitline BL) reaches the threshold voltage VTH at a time T5.

Moreover, and as shown in FIG. 4G, the time T1 is lower than the time T2, the time T2 is lower than the time T3, the time T3 is lower than the time T4, and the time T4 is lower than the time T5. In examples, the reference voltage VREF is defined to be higher than the threshold voltage. For example, the reference voltage VREF can be in a range of 0.5V-0.7V. Each of the sensing node voltages VSEN are compared with the reference voltage VREF to determine the output voltages Vouts.

FIG. 4F illustrates a graph representing the output voltages Vouts in accordance with some embodiments of the disclosure. For example, a sixth plurality of plots 412 (that is, a first sixth plot 412a, a second sixth plot 412b, a third sixth plot 412c, a fourth sixth plot 412d, and a fifth sixth plot 412e) of FIG. 4F represent the output voltages Vouts for different MAC values on a bitline BL of memory array 102. In examples, first sixth plot 412a represents the output voltage Vout for the first MAC value, second sixth plot 412b represents the output voltage Vout for the second MAC value, third sixth plot 412c represents the output voltage Vout for the third MAC value, fourth sixth plot 412d represents the output voltage Vout for the fourth MAC value, and fifth sixth plot 412e represents the output voltage Vout for the fifth MAC value. The first MAC value, the second MAC value, the third MAC value, the fourth MAC value, and the fifth MAC value are different from each other. For example, the first MAC value is less than the second MAC value, the second MAC value is less than the third MAC value, the third MAC value is less than the fourth MAC value, and the fourth MAC value is less than the fifth MAC value. As shown in FIG. 4F, the output voltages Vouts rise to a logic high when the sensing node voltages VSENs rise above the reference voltage.

In example embodiments, compared with the voltage domain MAC operation, the time domain MAC operation enlarges the minimum sensing margin as a result of the output voltage Vout generated by CIC 202 and comparator 204. For example, and as shown in FIG. 4C, the minimum sensing margin for the voltage domain MAC operation is $\Delta t_1$, where $\Delta t_1$ is defined as a time difference between sensing a first MAC value from first third plot 406a and sensing a second MAC value from second third plot 406b. On the other hand, the minimum sensing margin for the time domain MAC operation is $\Delta t_2$, where $\Delta t_2$ is defined as a time difference between sensing the first MAC value from first sixth plot 412a and sensing the second MAC value from second sixth plot 412b. The minimum sensing margin $\Delta t_2$ for the time domain MAC operation is greater than the minimum sensing margin $\Delta t_1$ for the voltage domain MAC operation. For example, the minimum sensing margin $\Delta t_1$ can be 42 pico seconds while the minimum sensing margin $\Delta t_2$ can be 61.9 pico seconds.

Figure 5:
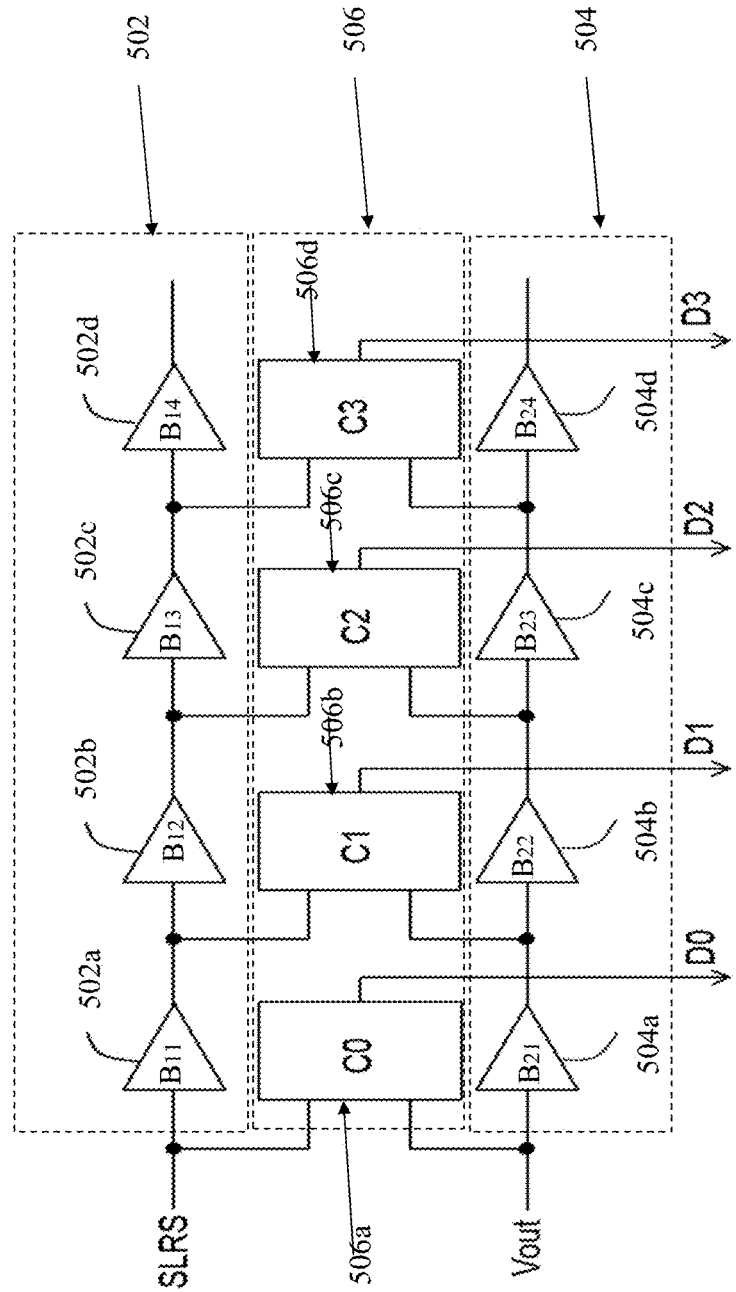
FIG. 5 illustrates a first example Time-to-Digital Circuit (TDC) in accordance with some embodiments of the disclosure.

FIG. 5 illustrates TDC 206 in accordance with some embodiments of the disclosure. In examples, TDC 206 provides the MAC values (referred to as MACV) as an output based on a time associated with the output voltage Vout. In other words, the time at which the output voltage signal Vout reaches the threshold voltage VTH, which indicates the resistance states of the memory cells connected to the bitline BL (i.e. MAC value) is converted to a digital value by the TDC 206. As shown in FIG. 5, TDC 206 includes a first delay circuit 502, a second delay circuit 504, and output circuits 506. The TDC 206 is configured to compare the timing of output voltage signal Vout to a baseline signal SLRS, which corresponds to a lowest resistance state of the bitline (i.e. 0 high resistance and 1 low resistance memory cells connected to the bitline BL, or plot 410a in FIG. 4G). First delay circuit 502 includes a first plurality of delay elements $B_{1i}$, for example, a first delay element $B_{11}$ 502a, a second delay element $B_{12}$ 502b, a third delay element $B_{13}$ 502c, and a fourth delay element $B_{14}$ 502d. First delay element $B_{11}$ 502a is associated with a first predetermined time delay $T_{B11}$, second delay element $B_{12}$ 502b is associated with a second predetermined time delay $T_{B12}$, third delay element $B_{13}$ 502c is associated with a third predetermined time delay $T_{B13}$, and fourth delay element $B_{14}$ 502d is associated with a fourth predetermined time delay $T_{B14}$. In examples, each of first delay circuit 502 and second delay circuit 504 are shown to include four delay elements, a different number of delay elements can be used for each of first delay circuit 502 and second delay circuit 504.

Second delay circuit 504 includes a second plurality of delay elements $B_{2i}$, for example, a fifth delay element $B_{21}$ 504a, a sixth delay element $B_{22}$ 504b, a seventh delay element $B_{23}$ 504c, and an eighth delay element $B_{24}$ 504d. Fifth delay element $B_{21}$ 504a is associated with a fifth predetermined time delay $T_{B21}$, sixth delay element $B_{22}$ 504b is associated with a sixth predetermined time delay $T_{B22}$, seventh delay element $B_{23}$ 504c is associated with a seventh predetermined time delay $T_{B23}$, and eighth delay element $B_{24}$ 504d is associated with an eighth predetermined time delay $T_{B24}$.

Each of the first plurality of delay elements $B_{1i}$ and each of the second plurality of delay elements $B_{2i}$ include an input terminal and an output terminal. Output circuits 506 include a first output circuit C0 506a, a second output circuit C1 506b, a third output circuit C2 506c, and a fourth output circuit C3 506d. Each of output circuits 506 include a first input terminal, a second input terminal, and an output terminal. Output circuits 506 sample signal from the input terminals. In examples, output circuits 506 is shown to include four output circuits, a different number of output circuits can be used.

In examples, first delay element $B_{11}$ 502a receives the SLRS signal (corresponding to the lowest resistance state) at the input terminal, delays the received SLRS signal by the first predetermined time delay $T_{B11}$, and provides a delayed SLRS signal at the output terminal. The input terminal of second delay element $B_{12}$ 502b is connected to the output terminal of first delay element $B_{11}$ 502a. Second delay element $B_{12}$ 502b receives the delayed SLRS signal from first delay element $B_{11}$ 502a, further delays the delayed SLRS signal by the second predetermined delay time $T_{B12}$, and provides the delayed SLRS signal at the output terminal. The input terminal of third delay element $B_{13}$ 502c is connected to the output terminal of second delay element $B_{12}$ 502b. Third delay element $B_{13}$ 502c receives the delayed SLRS signal from second delay element $B_{12}$ 502b, further delays the delayed SLRS signal by the third predetermined delay time $T_{B13}$, and provides the delayed SLRS signal at the output terminal. The input terminal of fourth delay element $B_{14}$ 502d is connected to the output terminal of third delay element $B_{13}$ 502c. Fourth delay element $B_{14}$ 502d receives the delayed SLRS signal from third delay element $B_{13}$ 502c, further delays the delayed SLRS signal by the fourth predetermined delay time $T_{B14}$, and provides the delayed SLRS signal at the output terminal.

Fifth delay element $B_{21}$ 504a receives the output voltage Vout signal at the input terminal, delays the received output voltage Vout signal by the fifth predetermined time delay $T_{B21}$, and provides a delayed output voltage Vout signal at the output terminal. The input terminal of sixth delay element $B_{22}$ 504b is connected to the output terminal of fifth delay element $B_{21}$ 504a. Sixth delay element $B_{22}$ 504b receives the delayed output voltage Vout signal from fifth delay element $B_{21}$ 504a, further delays the delayed output voltage Vout signal by the sixth predetermined delay time $T_{B22}$, and provides the delayed output voltage Vout signal at the output terminal. The input terminal of seventh delay element $B_{23}$ 504c is connected to the output terminal of sixth delay element $B_{22}$ 504b. Seventh delay element $B_{23}$ 504c receives the delayed output voltage Vout signal from sixth delay element $B_{22}$ 504b, further delays the delayed output voltage Vout signal by the seventh predetermined delay time $T_{B23}$, and provides the delayed output voltage Vout signal at the output terminal. The input terminal of eighth delay element $B_{24}$ 504d is connected to the output terminal of seventh delay element $B_{23}$ 504c. Eighth delay element $B_{24}$ 504d receives the delayed output voltage Vout signal from seventh delay element $B_{23}$ 504c, further delays the delayed output voltage Vout signal by the eighth predetermined delay time $T_{B24}$, and provides the delayed output voltage Vout signal at the output terminal.

The first input terminal of first output circuit C0 506a receives the SLRS signal and the second input terminal of first output circuit C0 506a receives the output voltage Vout signal. First output circuit C0 506a provides a first digital output D0 at the output terminal based on sampling of the SLRS signal and the output voltage Vout signal. More particularly, first output circuit C0 506a compares timing of an un-delayed output voltage Vout to the SLRS signal.

The first input terminal of second output circuit C1 506b is connected to the output terminal of first delay element $B_{11}$ 502a and the second input terminal of second output circuit C1 506b is connected to the output terminal of fifth delay element $B_{21}$ 504a. Second output circuit C1 506b receives the delayed SLRS signal at the first input terminal from first delay element $B_{11}$ 502a and receives the delayed output voltage Vout signal at the second input terminal from fifth delay element $B_{21}$ 504a. Second output circuit C1 506b provides a second digital output D1 at the output terminal based on sampling of the delayed SLRS signal and the delayed output voltage Vout signal. More particularly, second output circuit C1 506b provides second digital output D1 based on a comparison of the output voltage signal Vout as delayed first delay element $B_{11}$ 502a to the SLRS signal as delayed by fifth delay element $B_{21}$ 504a.

Moreover, the first input terminal of third output circuit C2 506c is connected to the output terminal of second delay element $B_{12}$ 502b and the second input terminal of third output circuit C2 506c is connected to the output terminal of sixth delay element $B_{22}$ 504b. Third output circuit C2 506c receives the delayed SLRS signal at the first input terminal from second delay element $B_{12}$ 502b and receives the delayed output voltage Vout signal at the second input terminal from sixth delay element $B_{22}$ 504b. Third output circuit C2 506c provides a third digital output D2 at the output terminal based on sampling of the delayed SLRS signal and the delayed output voltage Vout signal. More particularly, third output circuit C2 506c provides third digital output D2 based on a comparison of the output voltage signal Vout as delayed first delay element $B_{11}$ 502a and second delay element $B_{12}$ 502b to the SLRS signal as delayed by fifth delay element $B_{21}$ 504a and sixth delay element $B_{22}$ 504b.

In addition, the first input terminal of fourth output circuit C3 506d is connected to the output terminal of third delay element $B_{13}$ 502c and the second input terminal of fourth output circuit C3 506d is connected to the output terminal of seventh delay element $B_{23}$ 504c. Fourth output circuit C3

506d receives the delayed SLRS signal at the first input terminal from third delay element $B_{13}$ 502c and receives the delayed output voltage Vout signal at the second input terminal from seventh delay element $B_{23}$ 504c. Fourth output circuit C3 506d provides a fourth digital output D3 at the output terminal based on sampling of the delayed SLRS signal and the delayed output voltage Vout signal. More particularly, fourth output circuit C3 506d provides fourth digital output D3 based on a comparison of the output voltage signal Vout as delayed first delay element $B_{11}$ 502a, second delay element $B_{12}$ 502b, and third delay element $B_{13}$ 502c to the SLRS signal as delayed by fifth delay element $B_{21}$ 504a, sixth delay element $B_{22}$ 504b, and seventh delay element $B_{23}$ 504c.

Figure 6:
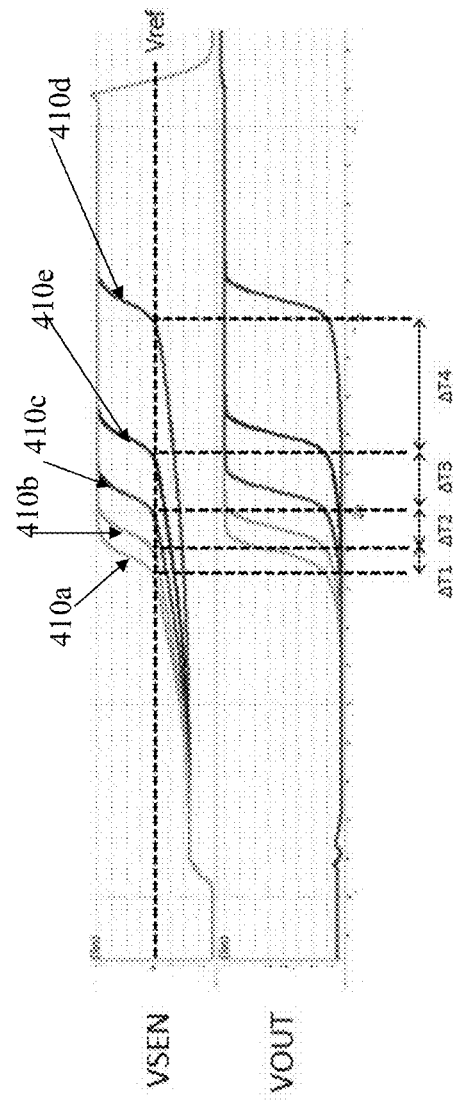
FIG. 6 illustrates the time margin between the output voltage Vout signals in accordance with some embodiments of the disclosure.

In examples, the sampling time for output circuits 506 is determined based on a time margin ($\Delta T$) between the output voltage Vout signals. FIG. 6 illustrates a graph showing the time margins between the output voltage Vout signals. For example, and as shown in FIG. 6, a first time margin $\Delta T_1$ represents the time margin between the output voltage Vout signals corresponding to the first MAC value (0 high resistance and 4 low resistance memory cells, i.e. SLRS) and the second MAC value (1 high resistance and 3 low resistance memory cells). Moreover, a second time margin $\Delta T_2$ represents the time margin between the output voltage Vout signals corresponding to the second MAC value and the third MAC value (2 high resistance and 2 low resistance memory cells). Furthermore, a third time margin $\Delta T_3$ represents the time margin between the output voltage Vout signals corresponding to the third MAC value and the fourth MAC value (3 high resistance and 1 low resistance memory cells). In addition, a fourth time margin $\Delta T_4$ represents the time margin between the output voltage Vout signals corresponding to the fourth MAC value and the fifth MAC value (4 high resistance and 0 low resistance memory cells).

Figure 7:
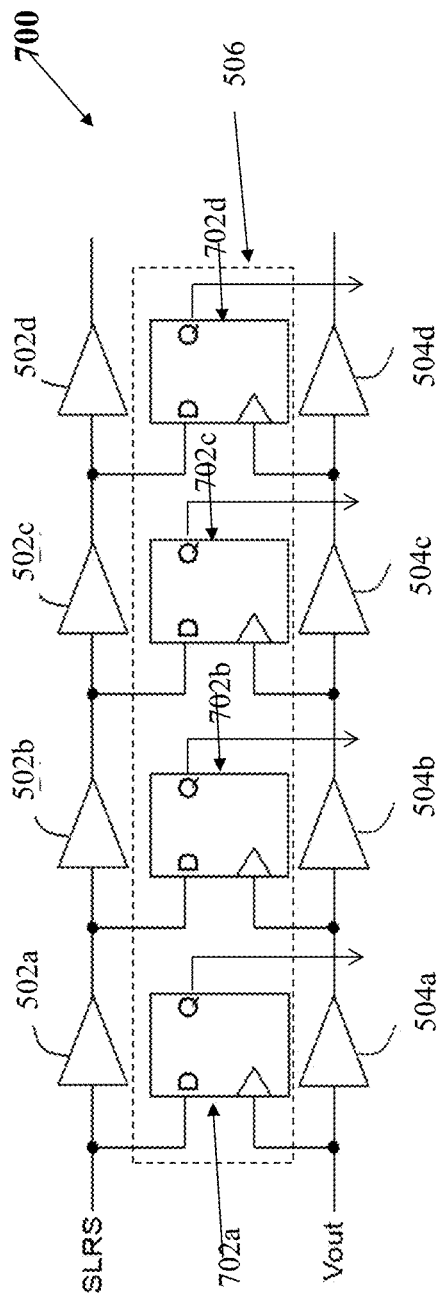
FIG. 7 illustrates a second example TDC in accordance with some embodiments of the disclosure.
Figure 8:
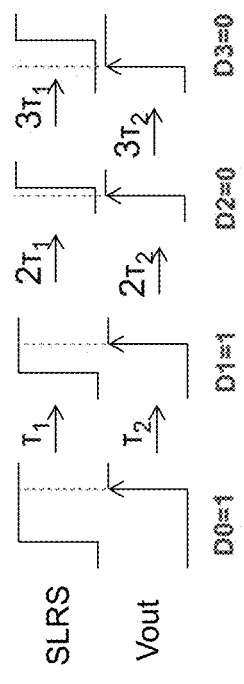
FIG. 8 is a timing diagram of the second TDC in accordance with some embodiments of the disclosure.

In example embodiments, the sampling time for each of output circuits $C_i$ is placed within its corresponding time margin $\Delta T$. In some examples, the sampling time for each of output circuits $C_i$ is placed within the middle of the corresponding time margin $\Delta T_i$ (that is, $T_{B1i} - T_{B2i} = \Delta T_{i-1}/2 + \Delta T_i/2$). For example, the sampling time for first output circuit C0 506a, that is, a delay difference between first delay element $B_{11}$ 502a and fifth delay element $B_{21}$ (that is, $T_{B11} - T_{B21}$) is placed in the middle of the first time margin $\Delta T_1$ (that is, $T_{B11} - T_{B21} = \Delta T_1/2$). Similarly, the sampling time for second output circuit C1 506b can be determined as:

$T_{B12} - T_{B22} +$ (time difference from earlier stage(s))
$= \Delta T_1 + \Delta T_2/2$ $T_{B12} - T_{B22} + (\Delta T_1/2) = \Delta T_1 + \Delta T_2/2$ $T_{B12} - T_{B22} = \Delta T_1/2 + \Delta T_2/2$ Moreover, the sampling time for third output circuit C2 506c can be determined as:

$T_{B13} - T_{B23} +$ (time difference from earlier stage(s))
$= \Delta T_1 + \Delta T_2 + \Delta T_3/2$ $T_{B13} - T_{B23} + (\Delta T_1/2) + (\Delta T_1/2 + \Delta T_2/2) = \Delta T_1 + \Delta T_2 + \Delta T_3/2$ $T_{B13} - T_{B23} = \Delta T_2/2 + \Delta T_3/2$ In examples, output circuits 506 include flip-flops, for example, D flip-flops. FIG. 7 illustrates a second example TDC 700 in accordance with some embodiments of the disclosure. As shown in FIG. 7, output circuits 506 include flip-flops 702, that is, a first flip-flop 702a, a second flip-flop 702b, a third flip-flop 702c, and a fourth flip-flop 702d. Each of flip-flops 702 include a D-terminal, a clock terminal, and a Q terminal. In some examples, other types of flip-flops may be used for output circuits 506. FIG. 8 is a timing diagram of second TDC 700 in accordance with some embodiments of the disclosure, illustrating an example digital output for the MAC value.

The D terminal of first flip-flop 702a receives the SLRS signal and the clock terminal of first flip-flop 702a receives the output voltage Vout signal. First flip-flop 702a provides a first digital output D0 at the Q terminal based on sampling of the SLRS signal and the output voltage Vout signal. As noted above, the TDC 700 converts the time-based Vout signal to a digital value representing the MAC value. More particularly, the Vout signal is compared to the SLRS signal to determine at which time interval $\Delta T_1$, $\Delta T_2$, $\Delta T_3$, $\Delta T_4$ the VSEN signal crosses the threshold voltage VTH. In the example shown in FIG. 8, the first digital output D0 is 1 for first flip-flop 702a as when the output voltage Vout signal rises to a logic high at the clock input after the SLRS signal has been input to the D terminal of first flip-flop 702a as a logic high.

The D terminal of second flip-flop 702b is connected to the output terminal of first delay element $B_{11}$ 502a and the clock terminal of second flip-flop 702b is connected to the output terminal of fifth delay element $B_{21}$ 504a. Second flip-flop 702b receives the delayed SLRS signal at the D terminal from first delay element $B_{11}$ 502a and receives the delayed output voltage Vout signal at the clock terminal from fifth delay element $B_{21}$ 504a. Second flip-flop 702b provides a second digital output D1 at the Q terminal based on sampling of the delayed SLRS signal and the delayed output voltage Vout signal. In the example shown in FIG. 8, the second digital output D1 is 1 for second flip-flop 702b as when the delayed output voltage Vout signal rises to a logic high at the clock input after the delayed Vout signal is received at the D terminal of second flip-flop 702b.

Moreover, the D terminal of third flip-flop 702c is connected to the output terminal of second delay element $B_{12}$ 502b and the clock terminal of third flip-flop 702c is connected to the output terminal of sixth delay element $B_{22}$ 504b. Third flip-flop 702c receives the delayed SLRS signal at the D terminal from second delay element $B_{12}$ 502b and receives the delayed output voltage Vout signal at the clock terminal from sixth delay element $B_{22}$ 504b. Third flip-flop 702c provides a third digital output D2 at the Q terminal based on sampling of the delayed SLRS signal and the delayed output voltage Vout signal. In the example shown in FIG. 8, the third digital output D2 is 0 for third flip-flop 702c as when the delayed output voltage Vout signal rises to a logic high at the clock input after before delayed Vout signal is received at the D terminal of third flip-flop 702c.

The D terminal of fourth flip-flop 702d is connected to the output terminal of third delay element $B_{13}$ 502c and the clock terminal of fourth flip-flop 702d is connected to the output terminal of seventh delay element $B_{23}$ 504c. Fourth flip-flop 702d receives the delayed SLRS signal at the D terminal from third delay element $B_{13}$ 502c and receives the delayed output voltage Vout signal at the clock terminal from seventh delay element $B_{23}$ 504c. Fourth flip-flop 702d provides a fourth digital output D3 at the Q terminal based on sampling of the delayed SLRS signal and the delayed output voltage Vout signal. In the example shown in FIG. 8, the fourth digital output D3 is 0 for fourth flip-flop 702d as when the delayed output voltage Vout signal rises to a logic high at the clock input after the delayed Vout signal is received at the D terminal of fourth flip-flop 702d is at a logic low.

Figure 9:
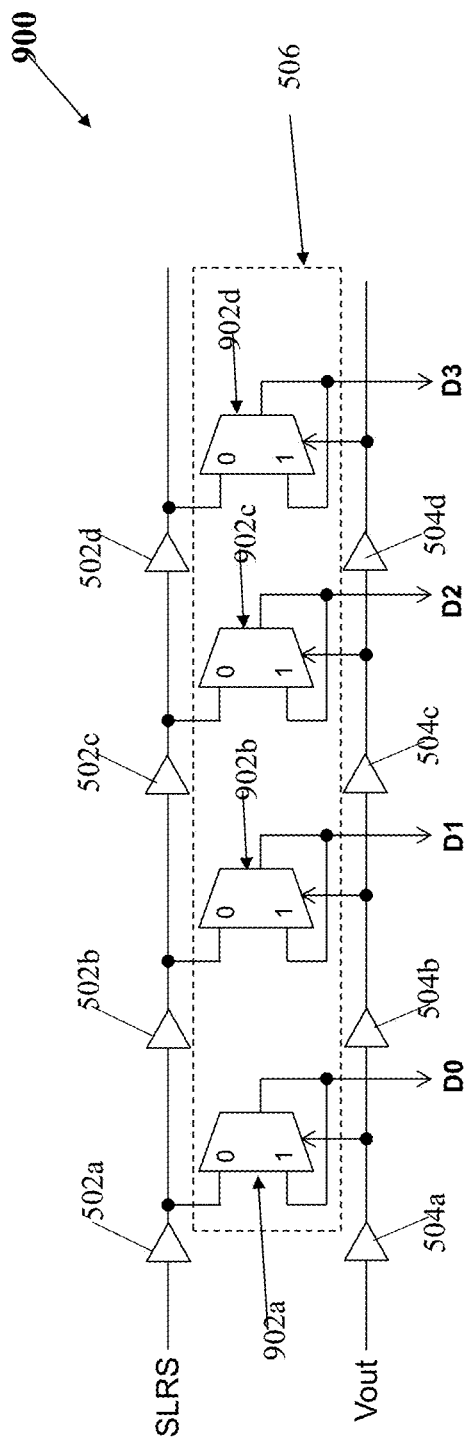
FIG. 9 illustrates a third example TDC in accordance with some embodiments of the disclosure.
Figure 10:
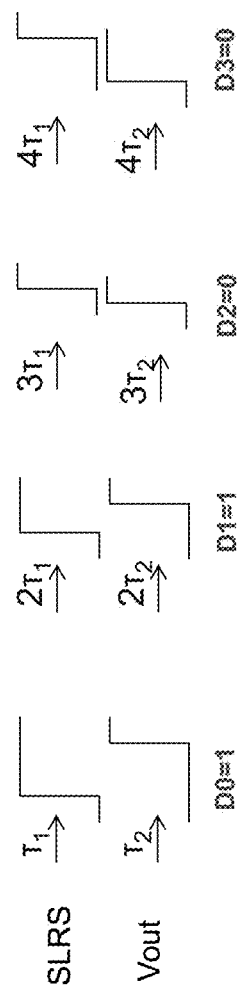
FIG. 10 is a timing diagram of the third TDC in accordance with some embodiments of the disclosure.

In examples, output circuits 506 include multiplexers. FIG. 9 illustrates a third example TDC 900 in accordance with some embodiments of the disclosure. As shown in FIG. 9, output circuits 506 include multiplexers 902, that is, a first multiplexer 902a, a second multiplexer 902b, a third multiplexer 902c, and a fourth multiplexer 902d. Each of multiplexers 902 include a first input terminal, a second input terminal, and an output terminal. FIG. 10 is a timing diagram of third TDC 900 in accordance with some embodiments of the disclosure, illustrating another example digital output for the MAC value.

The first input terminal of first multiplexer 902a is connected to the output terminal of first delay element $B_{11}$ 502a and receives the delayed SLRS signal. The second input terminal of first multiplexer 902a is connected to the output terminal in a feedback mode. The select input terminal of first multiplexer 902a is connected to the output terminal of fifth delay element $B_{11}$ 504a and receives the delayed Vout signal. First multiplexer 902a provides a first digital output D0 at the output terminal based on sampling of the SLRS signal and the first digital output D0. The sampling of first multiplexer 902a is triggered by the delayed voltage output Vout signal. In the example shown in FIG. 10, the first digital output D0 is 1 for first multiplexer 902a as when the delayed output voltage Vout signal rises to a logic high after the delayed SLRS signal. In other words, the delayed Vout signal at the select input selects the "1" input of first multiplexer 902a.

The first input terminal of second multiplexer 902b is connected to the output terminal of second delay element $B_{12}$ 502b and receives the delayed SLRS signal. The second input terminal of second multiplexer 902b is connected to the output terminal in a feedback mode. The select input terminal of second multiplexer 902b is connected to the output terminal of sixth delay element $B_{22}$ 504b and receives the delayed Vout signal. Second multiplexer 902b provides a second digital output D1 at the output terminal based on sampling of the delayed SLRS signal and the second digital output D1. The sampling of second multiplexer 902b is triggered by the delayed voltage output Vout signal. In the example shown in FIG. 10, the second digital output D1 is 1 for second multiplexer 902b as when the delayed output voltage Vout signal rises to a logic high after the delayed SLRS signal. In other words, the delayed Vout signal at the select input selects the "1" input of second multiplexer 902b.

The first input terminal of third multiplexer 902c is connected to the output terminal of third delay element $B_{13}$ 502c and receives the delayed SLRS signal. The second input terminal of third multiplexer 902c is connected to the output terminal in a feedback mode. The select input terminal of third multiplexer 902c is connected to the output terminal of seventh delay element $B_{23}$ 504c and receives the delayed Vout signal. Third multiplexer 902c provides a third digital output D2 at the output terminal based on sampling of the delayed SLRS signal and the third digital output D2. The sampling of third multiplexer 902c is triggered by the delayed voltage output Vout signal. In the example shown in FIG. 10, the third digital output D2 is 0 for third multiplexer 902c as when the delayed output voltage Vout signal rises to a logic high before the delayed SLRS signal. In other words, the delayed Vout signal at the select input selects the "0" input of third multiplexer 902c.

The first input terminal of fourth multiplexer 902d is connected to the output terminal of fourth delay element $B_{24}$ 502d and receives the delayed SLRS signal. The second input terminal of fourth multiplexer 902d is connected to the output terminal in a feedback mode. The select input terminal of fourth multiplexer 902d is connected to the output terminal of eighth delay element $B_{14}$ 504d and receives the delayed Vout signal. Fourth multiplexer 902d provides a fourth digital output D3 at the output terminal based on sampling of the delayed SLRS signal and the fourth digital output D3. The sampling of fourth multiplexer 902d is triggered by the delayed voltage output Vout signal. In the example shown in FIG. 10, the fourth digital output D3 is 0 for fourth multiplexer 902d as when the delayed output voltage Vout signal rises to a logic high before the delayed SLRS signal. In other words, the delayed Vout signal at the select input selects the "0" input of fourth multiplexer 902d.

Figure 11:
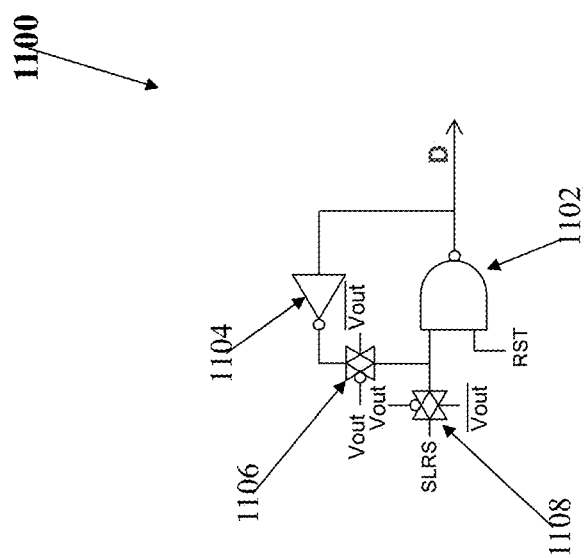
FIG. 11 illustrates an example latch in accordance with some embodiments of the disclosure.

In examples, each of the output circuits 506a-506d include a respective latch. FIG. 11 illustrates an example latch 1100 in accordance with some embodiments. For simplicity, only a single latch 1100 of the output circuit 506 is shown in FIG. 11. Latch 1100 includes a NAND logic circuit 1102, an invertor circuit 1104, a first transmission gate 1106, and a second transmission gate 1108. An input terminal of second transmission gate 1108 receives the SLRS signal or the delayed SLRS signal. The control terminals for second transmission gate 1108 receive the output voltage Vout signal or the delayed output voltage Vout signal. The output terminal of second transmission gate 1108 is connected to a first input terminal of NAND logic circuit 1102. A second input terminal of NAND logic circuit 1102 receives a reset signal. AN output terminal of NAND logic circuit 1102 provides the digital output D.

An input terminal of invertor circuit 1104 is connected to the output terminal of NAND logic circuit 1102. An output terminal of invertor circuit 1104 is connected to an input terminal of first transmission gate 1106. An output terminal of first transmission gate 1106 is connected to the first input terminal of NAND logic circuit 1102. The control terminals for first transmission gate 1106 receive the output voltage Vout signal or the delayed output voltage Vout signal. In examples, each of first transmission gate 1106 and second transmission gate 1108 are symmetrical. That is, the input terminal of each of first transmission gate 1106 and second transmission gate 1108 can be the output terminal, and vice versa.

During operation, when the output voltage Vout signal is at a logic low, the reset signal is transitioned to a logic high. The digital output D of latch 1100 is inverse of the SLRS signal or the delayed SLRS signal, and a latch loop in latch 1100 is formed. When the output voltage Vout signal is at a logic high, the reset signal is transitioned to a logic low. The digital output D of latch 1100 is then set at 1.

Figure 12:
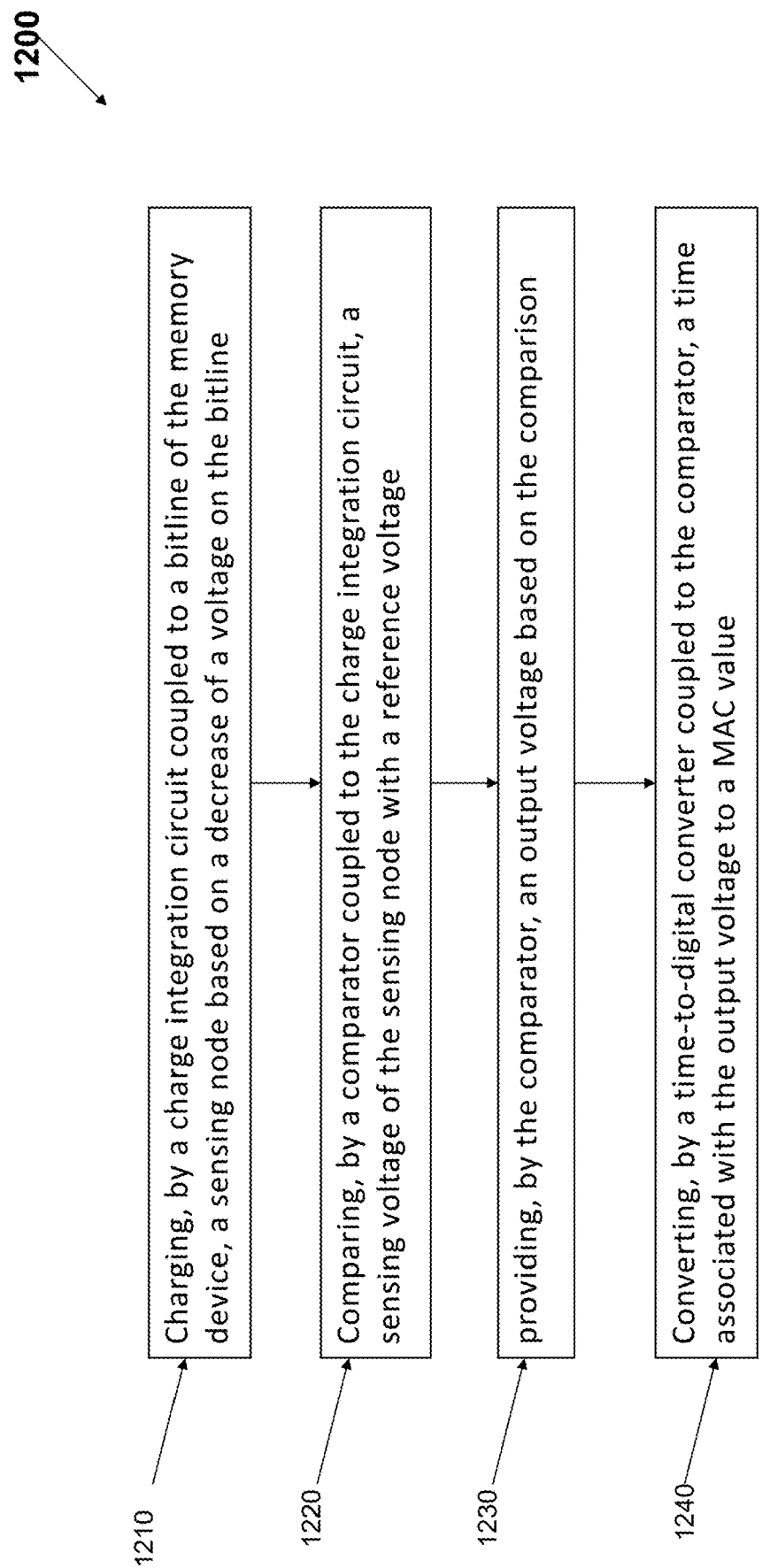
FIG. 12 illustrates a flow diagram for a MAC operation in a memory device in accordance with some embodiments of the disclosure.

FIG. 12 illustrates a flow diagram for a method 1200 of MAC operation in a memory device in accordance with some embodiments of the disclosure. In examples, method 1200 can be performed in memory device 100 discussed with reference to FIGS. 1-11 of the disclosures. In some examples, method 1200 can be stored as instructions which when executed by a processor perform method 1200. For example, the instructions can be stored on a non-transitory computer readable medium.

At block 1210 of method 1200 a sensing node is charged based on a decrease of a voltage on the bitline. For example, CIC 202 which is coupled to a bitline BL of the memory device 100 charges the sensing node based on the decrease of the bitline voltage VBL.

At block 1220 of method 1200, the sensing voltage of the sensing node is compared with a reference voltage. For example, comparator 204 which coupled to CIC 202 compare the sensing node voltage VSEN with the reference voltage.

At block 1230 of method 1200, an output voltage is provided based on the comparison. For example, comparator 204 provides the output voltage Vout based on compare the sensing node voltage VSEN with the reference voltage VREF. In examples, when the sensing voltage VSEN is less than the reference voltage VREF, the output voltage Vout is pulled to a logic low and when the sensing voltage VSEN is equal to or greater than the reference voltage VREF, the output voltage Vout is raised to a logic high.

At block 1240 of method 1200, a time associated with the output voltage is converted to a MAC value. In examples, the time associated with the output voltage is converted to a MAC value by TDC 206 coupled to the comparator 204. For example, TDC 206 receives the output voltage Vout from comparator 204 as well as an SLRS voltage signal corresponding to a lowest resistance state of memory cells coupled to the bitline BL, which represents a first MAC value. The TDC 206 compares time-delayed output voltage signals Vout to corresponding time-delayed SLRS signals to determine a time interval $\Delta T_1$, $\Delta T_2$, $\Delta T_3$, $\Delta T_4$ at which the VSEN signal crosses the threshold voltage VTH to provide the MAC values as the output of a MAC operation at an output terminal based on the time associated with the output voltage Vout.

In accordance with example embodiments, an I/O circuit for a memory device comprises: a charge integration circuit coupled to a bitline of the memory device, wherein the charge integration circuit provides a sensing voltage based on a decrease of a voltage on the bitline; a comparator coupled to the charge integration circuit, wherein the comparator compares the sensing voltage with a reference voltage and provides an output voltage based on the comparison; and a time-to-digital converter coupled to the comparator, wherein time-to-digital convertor converts a time associated with the output voltage to a digital value.

In example embodiments, a memory device comprises: a memory array comprising a plurality of rows and a plurality of columns, wherein each of the plurality of columns comprises a first plurality of memory cells connected to a bit line of a plurality of bitlines; a plurality of multiplexers, each of the plurality of multiplexers associated with a predetermined number of bitlines of the plurality of bitlines; and a plurality of Input/Output (I/O) circuits, wherein each of the plurality of I/O circuits is associated with one of the plurality of multiplexers, wherein a multiplexer connects an I/O circuit associated with the multiplexer to a bitline of the predetermined number of bitlines, and wherein the I/O circuit senses multiply-accumulate value for the bitline in time domain.

In accordance with example embodiments, a method of MAC operation in a memory device, comprises: connecting the charge integration circuit to a bitline of the memory device; charging, by a charge integration circuit, a sensing node based on a decrease of a voltage on the bitline; comparing, by a comparator coupled to the charge integration circuit, a sensing voltage of the sensing node with a reference voltage; providing, by the comparator, an output voltage based on the comparison; and converting, by a time-to-digital converter coupled to the comparator, a time associated with the output voltage to a MAC value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An Input/Output (I/O) circuit for a memory device, wherein the I/O circuit comprises:
   a charge integration circuit coupled to a bitline of the memory device, wherein the charge integration circuit provides a sensing voltage based on a decrease of a voltage on the bitline;
   a comparator coupled to the charge integration circuit, wherein the comparator compares the sensing voltage with a reference voltage and provides an output voltage based on the comparison; and
   a time-to-digital converter coupled to the comparator, wherein the time-to-digital convertor converts a time associated with the output voltage to a digital value.

2. The I/O circuit of claim 1, wherein the time-to-digital convertor comprises a first delay circuit, a second delay circuit, and output circuits connected to the first delay circuit and the second delay circuit.

3. The I/O circuit of claim 2, wherein the first delay circuit comprises a first plurality of delay elements connected in series, each of the first plurality of delay elements configured to delay a signal by a first predetermined delay time.

4. The I/O circuit of claim 2, wherein the second delay circuit comprises a second plurality of delay elements connected in series, each of the second plurality of delay elements configured to delay an output voltage signal by a second predetermined delay time.

5. The I/O circuit of claim 2, wherein each of the output circuits is configured to sample a predetermined signal and an output voltage signal and provide the digital value based on the sampling.

6. The I/O circuit of claim 2, wherein the output circuits comprise a plurality of flip-flops.

7. The I/O circuit of claim 2, wherein the output circuits comprise a plurality of multiplexers.

8. A memory device comprising:
   a memory array comprising a plurality of rows and a plurality of columns, wherein each of the plurality of columns comprises a first plurality of memory cells connected to a bit line of a plurality of bitlines;
   a plurality of multiplexers, each of the plurality of multiplexers associated with a predetermined number of bitlines of the plurality of bitlines; and
   a plurality of Input/Output (I/O) circuits, wherein each of the plurality of I/O circuits is associated with one of the plurality of multiplexers, wherein a multiplexer connects an I/O circuit associated with the multiplexer to a bitline of the predetermined number of bitlines, and wherein the I/O circuit senses multiply-accumulate value for the bitline in time domain.

9. The memory device of claim 8, wherein the I/O circuit comprises:
   a charge integration circuit coupled to the bitline, wherein the charge integration circuit provides a sensing voltage based on a decrease of a voltage on the bitline;
   a comparator coupled to the charge integration circuit, wherein the comparator compares the sensing voltage with a reference voltage and provides an output voltage based on the comparison; and
   a time-to-digital converter coupled to the comparator, wherein the time-to-digital convertor converts a time associated with the output voltage to a digital value.

10. The memory device of claim 9, wherein the charge integration circuit comprises a charge circuit connected to a sensing node, wherein the charge circuit charges the sensing node at a first rate, and wherein the sensing node provides the sensing voltage.

11. The memory device of claim 10, wherein the charge integration circuit further comprises a feedback circuit connected to the sensing node, wherein the feedback circuit charges the sensing node at a second rate.

12. The memory device of claim 11, wherein the second rate is greater than the first rate.

13. The memory device of claim 8, further comprising a controller, wherein the controller is operative to initiate a Multiply-Accumulate (MAC) operation.

14. The memory device of claim 13, wherein the controller selects one of the plurality of multiplexers for the MAC operation, and wherein the selected one of the plurality of multiplexers connects the bitline to the I/O circuit.

15. A method of Multiply-Accumulate (MAC) operation in a memory device, the method comprising:
- connecting a charge integration circuit to a bitline of the memory device;
- charging, by the charge integration circuit, a sensing node based on a decrease of a voltage on the bitline;
- comparing, by a comparator coupled to the charge integration circuit, a sensing voltage of the sensing node with a reference voltage;
- providing, by the comparator, an output voltage based on the comparison; and
- converting, by a time-to-digital converter coupled to the comparator, a time associated with the output voltage to a MAC value.

16. The method of claim 15, wherein charging the sensing node comprises charging the sensing node at a first rate till the sensing voltage is pulled to a threshold voltage.

17. The method of claim 16, wherein charging the sensing node comprises charging the sensing node at a second rate after the sensing voltage is pulled to the threshold voltage.

18. The method of claim 17, wherein the second rate is greater than the first rate.

19. The method of claim 15, wherein charging the sensing node comprises:
- charging the sensing node based on discharge rate of a bitline voltage of the bitline.

20. The method of claim 15, wherein connecting the charge integration circuit to the bitline comprises connecting the charge integration circuit to the bitline through a multiplexer.

* * * * *